US009343194B2

(12) United States Patent
Prince et al.

(10) Patent No.: US 9,343,194 B2
(45) Date of Patent: May 17, 2016

(54) PROCESS FOR THE FORMATION OF A SILVER BACK ELECTRODE OF A PASSIVATED EMITTER AND REAR CONTACT SILICON SOLAR CELL

(75) Inventors: Alistair Graeme Prince, Bristol (GB); Richard John Sheffield Young, Somerset (GB); Giovanna Laudisio, Bristol (GB); Gary Coultart, Bristol (GB); Kenneth Warren Hang, Hillsborough, NC (US); Ben Whittle, Bristol (GB)

(73) Assignee: EI DU PONT DE NEMOURS AND COMPANY, Wilmington, DE (US)

( * ) Notice: Subject to any disclaimer, the term of this patent is extended or adjusted under 35 U.S.C. 154(b) by 544 days.

(21) Appl. No.: 12/954,039

(22) Filed: Nov. 24, 2010

(65) Prior Publication Data

US 2011/0120551 A1 May 26, 2011

Related U.S. Application Data

(60) Provisional application No. 61/264,331, filed on Nov. 25, 2009.

(51) Int. Cl.

| | |
|---|---|
| ***H01L 31/18*** | (2006.01) |
| ***H01L 31/0224*** | (2006.01) |
| ***H01B 1/22*** | (2006.01) |
| ***B22F 7/04*** | (2006.01) |
| ***H01B 1/16*** | (2006.01) |
| ***B22F 7/08*** | (2006.01) |
| *C03C 8/12* | (2006.01) |
| *H01L 31/0264* | (2006.01) |
| *B22F 1/00* | (2006.01) |
| *C03C 8/10* | (2006.01) |

(52) U.S. Cl.

CPC ................ *H01B 1/22* (2013.01); *B22F 1/0059* (2013.01); *B22F 7/04* (2013.01); *B22F 7/08* (2013.01); *H01B 1/16* (2013.01); *H01L 31/022425* (2013.01); *H01L 31/1884* (2013.01); *B22F 1/007* (2013.01); *B22F 2007/047* (2013.01); *C03C 8/10* (2013.01); *C03C 8/12* (2013.01); *H01L 31/0264* (2013.01); *H01L 2924/00* (2013.01); *H01L 2924/0002* (2013.01); *Y02E 10/50* (2013.01); *Y02E 10/52* (2013.01)

(58) Field of Classification Search

CPC ............ B22F 1/0059; B22F 7/04; B22F 7/08; C04B 35/01; H01B 1/16; H01B 1/22; H01B 1/007; H01L 31/022425; H01L 31/1884; H01L 31/0264; Y02E 10/50

USPC ............................................ 136/256; 438/98

See application file for complete search history.

(56) References Cited

U.S. PATENT DOCUMENTS

| | | | | |
|---|---|---|---|---|
| 2006/0289055 | A1* | 12/2006 | Sridharan et al. | 136/252 |
| 2008/0223446 | A1* | 9/2008 | Wang et al. | 136/265 |
| 2011/0005582 | A1* | 1/2011 | Szlufcik et al. | 136/252 |

FOREIGN PATENT DOCUMENTS

| | | | |
|---|---|---|---|
| DE | 19744197 | A1 | 7/1998 |
| DE | 102004046554 | A1 | 4/2006 |
| DE | 102008033169 | A1 | 11/2009 |
| EP | 1713092 | A2 | 10/2006 |
| EP | 1713095 | A2 | 10/2006 |
| EP | 2068369 | A1 | 6/2009 |
| WO | 2006/005889 | A1 | 1/2006 |

OTHER PUBLICATIONS

Meemongkolkiat et al., "Investigation of modified screen-printing al pastes for local back surface field formation", IEEE 2006.*

P. Choulat et al., "Above 17 % industrial type PERC Solar Cell on thin Multi-Crystalline Silicon Substrate", 22nd European Photovoltaic Solar Energy Conference, Sep. 3-7, 2007, Milan, Italy.

International Search Report and Written Opinion for International Application No. PCT/US2010/057834 Dated Mar. 3, 2011.

* cited by examiner

*Primary Examiner* — Matthew Martin

(57) ABSTRACT

A process for the formation of an electrically conductive silver back electrode of a PERC silicon solar cell comprising the steps:

(1) providing a silicon wafer having an ARC layer on its front-side and a perforated dielectric passivation layer on its back-side,
(2) applying and drying a silver paste to form a silver back electrode pattern on the perforated dielectric passivation layer on the back-side of the silicon wafer, and
(3) firing the dried silver paste, whereby the wafer reaches a peak temperature of 700 to 900° C., wherein the silver paste has no or only poor fire-through capability and comprises particulate silver and an organic vehicle.

11 Claims, No Drawings

PROCESS FOR THE FORMATION OF A SILVER BACK ELECTRODE OF A PASSIVATED EMITTER AND REAR CONTACT SILICON SOLAR CELL

FIELD OF THE INVENTION

The present invention is directed to a process for the formation of a silver back electrode of a PERC (passivated emitter and rear contact) silicon solar cell and, respectively, to a process for the production of PERC silicon solar cells comprising said silver back electrode. The present invention is also directed to the respective PERC silicon solar cells.

TECHNICAL BACKGROUND OF THE INVENTION

Typically, silicon solar cells have both front- and back-side metallizations (front and back electrodes). A conventional silicon solar cell structure with a p-type base uses a negative electrode to contact the front-side or sun side of the cell, and a positive electrode on the back-side. It is well known that radiation of an appropriate wavelength falling on a p-n junction of a semiconductor body serves as a source of external energy to generate electron-hole pairs in that body. The potential difference that exists at a p-n junction, causes holes and electrons to move across the junction in opposite directions, thereby giving rise to flow of an electric current that is capable of delivering power to an external circuit. Most solar cells are in the form of a silicon wafer that has been metallized, i.e., provided with metal contacts which are electrically conductive.

The majority of the solar cells currently produced are based upon crystalline silicon. A popular method for depositing electrodes is the screen printing of metal pastes.

PERC silicon solar cells are well-known to the skilled person; see, for example, P. Choulat et al., "Above 17% industrial type PERC Solar Cell on thin Multi-Crystalline Silicon Substrate", 22$^{nd}$ European Photovoltaic Solar Energy Conference, 3-7 Sep. 2007, Milan, Italy. PERC silicon solar cells represent a special type of conventional silicon solar cells; they are distinguished by having a dielectric passivation layer on their front- and on their back-side. The passivation layer on the front-side serves as an ARC (antireflective coating) layer, as is conventional for silicon solar cells. The dielectric passivation layer on the back-side is perforated; it serves to extend charge carrier lifetime and as a result thereof improves light conversion efficiency. It is desired to avoid damage of the perforated dielectric back-side passivation layer as much as possible.

Similar to the production of a conventional silicon solar cell, the production of a PERC silicon solar cell typically starts with a p-type silicon substrate in the form of a silicon wafer on which an n-type diffusion layer (n-type emitter) of the reverse conductivity type is formed by the thermal diffusion of phosphorus (P) or the like. Phosphorus oxychloride ($POCl_3$) is commonly used as the gaseous phosphorus diffusion source, other liquid sources are phosphoric acid and the like. In the absence of any particular modification, the n-type diffusion layer is formed over the entire surface of the silicon substrate. The p-n junction is formed where the concentration of the p-type dopant equals the concentration of the n-type dopant. The cells having the p-n junction close to the sun side, have a junction depth between 0.05 and 0.5 μm.

After formation of this diffusion layer excess surface glass is removed from the rest of the surfaces by etching by an acid such as hydrofluoric acid.

Next, a dielectric layer, for example, of $TiO_x$, $SiO_x$, $TiO_x/SiO_x$, $SiN_x$ or, in particular, a dielectric stack of $SiN_x/SiO_x$ is formed on the front-side n-type diffusion layer. As a specific feature of the PERC silicon solar cell, the dielectric is also deposited on the back-side of the silicon wafer to a thickness of, for example, between 0.05 and 0.1 μm. Deposition of the dielectric may be performed, for example, using a process such as plasma CVD (chemical vapor deposition) in the presence of hydrogen or sputtering. Such a layer serves as both an ARC and passivation layer for the front-side and as a dielectric passivation layer for the back-side of the PERC silicon solar cell. The passivation layer on the back-side of the PERC silicon solar cell is then perforated. The perforations are typically produced by acid etching or laser drilling and the holes so produced are, for example, 50 to 300 μm in diameter. Their depth corresponds to the thickness of the passivation layer or may even slightly exceed it. The number of the perforations lies in the range of, for example, 100 to 500 per square centimeter.

Just like a conventional solar cell structure with a p-type base and a front-side n-type emitter, PERC silicon solar cells typically have a negative electrode on their front-side and a positive electrode on their back-side. The negative electrode is typically applied as a grid by screen printing and drying front-side silver paste (front electrode forming silver paste) on the ARC layer on the front-side of the cell. The front-side grid electrode is typically screen printed in a so-called H pattern which comprises thin parallel finger lines (collector lines) and two busbars intersecting the finger lines at right angle. In addition, a back-side silver or silver/aluminum paste and an aluminum paste are applied, typically screen printed, and successively dried on the perforated passivation layer on the back-side of the p-type silicon substrate. Normally, the back-side silver or silver/aluminum paste is applied onto the back-side perforated passivation layer first to form anodic back contacts, for example, as two parallel busbars or as rectangles or tabs ready for soldering interconnection strings (presoldered copper ribbons). The back-side aluminum paste is then applied in the bare areas with a slight overlap over the back-side silver or silver/aluminum. In some cases, the back-side silver or silver/aluminum paste is applied after the back-side aluminum paste has been applied. Firing is then typically carried out in a belt furnace for a period of 1 to 5 minutes with the wafer reaching a peak temperature in the range of 700 to 900° C. The front electrode and the back electrodes can be fired sequentially or cofired.

The back-side aluminum paste is generally screen printed and dried on the perforated dielectric passivation layer on the back-side of the silicon wafer. The wafer is fired at a temperature above the melting point of aluminum to form an aluminum-silicon melt at the local contacts between the aluminum and the silicon, i.e. at those parts of the silicon wafer's back-surface not covered by the dielectric passivation layer or, in other words, at the places of the perforations. The so-formed local p+ contacts are generally called local BSF (back surface field) contacts. The back-side aluminum paste is transformed by firing from a dried state to an aluminum back electrode, whereas the back-side silver or silver/aluminum paste becomes a silver or silver/aluminum back electrode upon firing. Typically, back-side aluminum paste and back-side silver or silver/aluminum paste are cofired, although sequential firing is also possible. During firing, the boundary between the back-side aluminum and the back-side silver or silver/aluminum assumes an alloy state, and is connected electrically as well. The aluminum electrode accounts for most areas of the back electrode. The silver or silver/aluminum back electrode is formed over portions of the back-side as an anode for interconnecting solar cells by means of pre-soldered copper ribbon or the like. In addition, the front-side silver paste printed as front-side cathode etches and penetrates through the ARC layer during firing, and is thereby able to electrically contact the n-type layer. This type of process is generally called "firing through".

SUMMARY OF THE INVENTION

The present invention relates to a process for the formation of an electrically conductive silver back electrode of a PERC silicon solar cell. Accordingly, it relates also to a process for the production of the PERC silicon solar cell comprising said electrically conductive silver back electrode and the PERC silicon solar cell itself.

The process for the formation of the electrically conductive silver back electrode of a PERC silicon solar cell comprises the steps:

(1) providing a silicon wafer having an ARC layer on its front-side and a perforated dielectric passivation layer on its back-side, (2) applying and drying a silver paste to form a silver back electrode pattern on the perforated dielectric passivation layer on the back-side of the silicon wafer, and (3) firing the dried silver paste, whereby the wafer reaches a peak temperature of 700 to 900° C., wherein the silver paste has no or only poor fire-through capability and comprises particulate silver and an organic vehicle.

In the description and the claims the term "silver paste" is used. It shall mean a thick film conductive silver composition comprising particulate silver either as the only or as the predominant electrically conductive particulate metal.

In the description and the claims the term "silver back electrode pattern" is used. It shall mean the arrangement of a silver back anode on the back-side of a PERC solar cell silicon wafer. This arrangement is characterized by coverage of only part of the wafer's back surface, i.e. bare areas are left into which an aluminum paste for formation of an aluminum back electrode is applied with a slight overlap with the silver back electrode. This slight overlap allows for making electrical connection between the aluminum back electrode and the silver back electrode by forming an alloy at the boundary between the aluminum and the silver upon firing. Typically, the silver back electrode covers only a small percentage of, for example, 2 to 5 area-% of the back-side perforated passivation layer. The silver back electrode may be arranged, for example, in the form of several, typically two, parallel narrow, for example, 3 to 6 mm wide busbars or as rectangles or tabs ready for soldering strings for interconnecting solar cells.

In the present description and the claims the term "fire-through capability" is used. It shall mean the ability of a metal paste to etch and penetrate through (fire through) a passivation or ARC layer during firing. In other words, a metal paste with fire-through capability is one that fires through a passivation or an ARC layer making electrical contact with the surface of the silicon substrate. Correspondingly, a metal paste with poor or even no fire through capability makes no electrical contact with the silicon substrate upon firing. To avoid misunderstandings; in this context the term "no electrical contact" shall not be understood absolute; rather, it shall mean that the contact resistivity between fired metal paste and silicon surface exceeds 1 $\Omega\cdot cm^2$, whereas, in case of electrical contact, the contact resistivity between fired metal paste and silicon surface is in the range of 1 to 10 $m\Omega\cdot cm^2$.

The contact resistivity can be measured by TLM (transfer length method). To this end, the following procedure of sample preparation and measurement may be used: A silicon wafer having a back-side passivation layer is screen printed on the passivation layer with the silver paste to be tested in a pattern of parallel 100 μm wide and 20 μm thick lines with a spacing of 2.05 mm between the lines and is then fired with the wafer reaching a peak temperature of 730° C. It is preferred for the sample preparation to use a silicon wafer with the same type of, but non-perforated, back-side passivation layer as is used in the process of the present invention. The fired wafer is laser-cut into 8 mm by 42 mm long strips, where the parallel lines do not touch each other and at least 6 lines are included. The strips are then subject to conventional TLM measurement at 20° C. in the dark. The TLM measurement can be carried out using the device GP 4-Test Pro from GP Solar.

DETAILED DESCRIPTION OF THE INVENTION

It has been found that the process of the present invention allows for the production of PERC silicon solar cells with improved electrical efficiency. The fired silver paste adheres well to the back-side perforated passivation layer and thus gives rise to a long durability or service life of the PERC silicon solar cells produced by the process of the present invention.

Without being bound to theory it is believed that the silver paste used in the process of the present invention for the production of the silver back electrode does not or not significantly damage the perforated dielectric passivation layer on the silicon wafer's back-side during firing.

In step (1) of the process of the present invention a silicon wafer having an ARC layer on its front-side and a perforated dielectric passivation layer on its back-side is provided. The silicon wafer is a mono- or polycrystalline silicon wafer as is conventionally used for the production of silicon solar cells; it has a p-type region, an n-type region and a p-n junction. The silicon wafer has an ARC layer on its front-side and a perforated dielectric passivation layer on its back-side, both layers, for example, of $TiO_x$, $SiO_x$, $TiO_x/SiO_x$, $SiN_x$ or, in particular, a dielectric stack of $SiN_x/SiO_x$. Such silicon wafers are well known to the skilled person; for brevity reasons reference is expressly made to the section "TECHNICAL BACKGROUND OF THE INVENTION". The silicon wafer may already be provided with the conventional front-side metallizations, i.e. with front-side silver paste as described above in the section "TECHNICAL BACKGROUND OF THE INVENTION". Application of the front-side metallization may be carried out before or after the silver back electrode is finished. To avoid misunderstandings, the front-side silver paste differs from the silver paste used for forming the silver back electrode; the front-side silver paste has fire-through capability.

In step (2) of the process of the present invention a silver paste is applied to form a silver back electrode pattern on the perforated dielectric passivation layer on the back-side of the silicon wafer. The silver paste has no or only poor fire-through capability and comprises particulate silver and an organic vehicle.

In a particular embodiment of the process of the present invention, the silver paste comprises at least one glass frit selected from the group consisting of (i) lead-free glass frits with a softening point temperature in the range of 550 to 611° C. and containing 11 to 33 wt.-% (weight-%) of $SiO_2$, >0 to 7 wt.-%, in particular 5 to 6 wt.-% of $Al_2O_3$ and 2 to 10 wt.-% of $B_2O_3$ and (ii) lead-containing glass frits with a softening point temperature in the range of 571 to 636° C. and containing 53 to 57 wt.-% of PbO, 25 to 29 wt.-% of $SiO_2$, 2 to 6 wt.-% of $Al_2O_3$ and 6 to 9 wt.-% of $B_2O_3$.

In the description and the claims the term "softening point temperature" is used. It shall mean the glass transition temperature, determined by differential thermal analysis DTA at a heating rate of 10 K/min.

The particulate silver may be comprised of silver or a silver alloy with one or more other metals like, for example, copper. In case of silver alloys the silver content is, for example, 99.7 to below 100 wt. %. In an embodiment, the particulate silver is silver powder. The silver powder may be uncoated or at least partially coated with a surfactant. The surfactant may be selected from, but is not limited to, stearic acid, palmitic acid, lauric acid, oleic acid, capric acid, myristic acid and linolic acid and salts thereof, for example, ammonium, sodium or potassium salts. The silver powder exhibits an average particle size of, for example, 0.5 to 5 μm. The particulate silver may be present in the silver paste in a proportion of 50 to 92 wt. %, or, in an embodiment, 65 to 84 wt. %, based on total silver paste composition.

In the present description and the claims the term "average particle size" is used. It shall mean the average particle size (mean particle diameter, d50) determined by means of laser scattering.

All statements made in the present description and the claims in relation to average particle sizes relate to average particle sizes of the relevant materials as are present in the silver paste composition.

The particulate silver present in the silver paste may be accompanied by a small amount of one or more other particulate metals or particulate silicon. Examples of other particulate metals include copper powder, palladium powder, nickel powder, chromium powder and, in particular, aluminum powder. In an embodiment, the silver paste is free of other particulate metal(s) and particulate silicon. In another embodiment, the particulate metal content of the silver paste comprises 95 to 99 wt. % of particulate silver and 1 to 5 wt. % of particulate aluminum.

The silver paste comprises an organic vehicle. A wide variety of inert viscous materials can be used as organic vehicle. The organic vehicle may be one in which the particulate constituents (particulate silver, optionally present other particulate metals, optionally present particulate silicon, glass frit, further optionally present inorganic particulate constituents) are dispersible with an adequate degree of stability. The properties, in particular, the rheological properties, of the organic vehicle may be such that they lend good application properties to the silver paste composition, including: stable dispersion of insoluble solids, appropriate viscosity and thixotropy for application, in particular, for screen printing, appropriate wettability of the silicon wafer's back-side perforated passivation layer and the paste solids, a good drying rate, and good firing properties. The organic vehicle used in the silver paste may be a nonaqueous inert liquid. The organic vehicle may be an organic solvent or an organic solvent mixture; in an embodiment, the organic vehicle may be a solution of organic polymer(s) in organic solvent(s). In an embodiment, the polymer used for this purpose may be ethyl cellulose. Other examples of polymers which may be used alone or in combination include ethylhydroxyethyl cellulose, wood rosin, phenolic resins and poly(meth)acrylates of lower alcohols. Examples of suitable organic solvents comprise ester alcohols and terpenes such as alpha- or beta-terpineol or mixtures thereof with other solvents such as kerosene, dibutylphthalate, diethylene glycol butyl ether, diethylene glycol butyl ether acetate, hexylene glycol and high boiling alcohols. In addition, volatile organic solvents for promoting rapid hardening after application of the silver paste on the back-side perforated passivation layer can be included in the organic vehicle. Various combinations of these and other solvents may be formulated to obtain the viscosity and volatility requirements desired.

The organic vehicle content in the silver paste may be dependent on the method of applying the paste and the kind of organic vehicle used, and it can vary. In an embodiment, it may be from 20 to 45 wt. %, or, in an embodiment, it may be in the range of 22 to 35 wt. %, based on total silver paste composition. The number of 20 to 45 wt. % includes organic solvent(s), possible organic polymer(s) and possible organic additive(s).

The organic solvent content in the silver paste may be in the range of 5 to 25 wt. %, or, in an embodiment, 10 to 20 wt. %, based on total silver paste composition.

The organic polymer(s) may be present in the organic vehicle in a proportion in the range of 0 to 20 wt. %, or, in an embodiment, 5 to 10 wt. %, based on total silver paste composition.

In the particular embodiment of the process of the present invention, the silver paste comprises at least one glass frit selected from the group consisting of (i) lead-free glass frits with a softening point temperature in the range of 550 to 611° C. and containing 11 to 33 wt.-% of $SiO_2$, >0 to 7 wt.-%, in particular 5 to 6 wt.-% of $Al_2O_3$ and 2 to 10 wt.-% of $B_2O_3$ and (ii) lead-containing glass frits with a softening point temperature in the range of 571 to 636° C. and containing 53 to 57 wt.-% of PbO, 25 to 29 wt.-% of $SiO_2$, 2 to 6 wt.-% of $Al_2O_3$ and 6 to 9 wt.-% of $B_2O_3$.

In case of the lead-free glass frits of type (i), the weight percentages of $SiO_2$, $Al_2O_3$ and $B_2O_3$ do not total 100 wt.-% and the missing wt.-% are in particular contributed by one or more other oxides, for example, alkali metal oxides like $Na_2O$, alkaline earth metal oxides like MgO and metal oxides like $Bi_2O_3$, $TiO_2$ and ZnO.

The lead-free glass frits of type (i) may contain 40 to 73 wt.-%, in particular 48 to 73 wt.-% of $Bi_2O_3$. The weight percentages of $Bi_2O_3$, $SiO_2$, $Al_2O_3$ and $B_2O_3$ may or may not total 100 wt.-%. In case they do not total 100 wt.-% the missing wt.-% may in particular be contributed by one or more other oxides, for example, alkali metal oxides like $Na_2O$, alkaline earth metal oxides like MgO and metal oxides like $TiO_2$ and ZnO.

In case of the lead-containing glass frits of type (ii), the weight percentages of PbO, $SiO_2$, $Al_2O_3$ and $B_2O_3$ may or may not total 100 wt.-%. In case they do not total 100 wt.-% the missing wt.-% may in particular be contributed by one or more other oxides, for example, alkali metal oxides like $Na_2O$, alkaline earth metal oxides like MgO and metal oxides like $TiO_2$ and ZnO.

In case the silver paste used in the particular embodiment of the process of the present invention comprises lead-free glass frit of type (i) as well as lead-containing glass frit of type (ii), the ratio between both glass frit types may be any or, in other words, in the range of from >0 to infinity. Generally, the silver paste as used in the particular embodiment of the process of the present invention comprises no glass frit other than glass frit selected from the group consisting of types (i) and (ii).

The one or more glass frits selected from the group consisting of types (i) and (ii) serve as inorganic binder. The average particle size of the glass frit(s) is in the range of, for example, 0.5 to 4 μm. The total content of glass frit selected from the group consisting of types (i) and (ii) in the silver paste as used in the particular embodiment of the process of the present invention is, for example, 0.25 to 8 wt.-%, or, in an embodiment, 0.8 to 3.5 wt.-%.

The preparation of the glass frits is well known and consists, for example, in melting together the constituents of the glass, in particular in the form of the oxides of the constituents, and pouring such molten composition into water to form the frit. As is well known in the art, heating may be conducted to a peak temperature in the range of, for example, 1050 to 1250° C. and for a time such that the melt becomes entirely liquid and homogeneous, typically, 0.5 to 1.5 hours.

The glass may be milled in a ball mill with water or inert low viscosity, low boiling point organic liquid to reduce the particle size of the frit and to obtain a frit of substantially uniform size. It may then be settled in water or said organic liquid to separate fines and the supernatant fluid containing the fines may be removed. Other methods of classification may be used as well.

With regard to adhesion of the fired silver paste to the back-side perforated passivation layer it may be advantageous for the silver paste to contain a small amount of at least one antimony oxide. Therefore, in an embodiment, the silver paste used in the process of the present invention may comprise at least one antimony oxide. The at least one antimony oxide may be contained in the silver paste in a total proportion of, for example, 0.05 to 1.5 wt.-%, based on total silver paste composition, wherein the at least one antimony oxide may be present as separate particulate constituent(s) and/or as glass frit constituent(s). Examples of suitable antimony oxides include $Sb_2O_3$ and $Sb_2O_5$, wherein $Sb_2O_3$ is the preferred antimony oxide.

The silver paste may comprise one or more organic additives, for example, surfactants, thickeners, rheology modifiers and stabilizers. The organic additive(s) may be part of the organic vehicle. However, it is also possible to add the organic additive(s) separately when preparing the silver paste. The organic additive(s) may be present in the silver paste in a total proportion of, for example, 0 to 10 wt. %, based on total silver paste composition.

The silver paste of the present invention is a viscous composition, which may be prepared by mechanically mixing the particulate silver and the glass frit(s) with the organic vehicle. In an embodiment, the manufacturing method power mixing, a dispersion technique that is equivalent to the traditional roll milling, may be used; roll milling or other mixing technique can also be used.

The silver paste can be used as such or may be diluted, for example, by the addition of additional organic solvent(s); accordingly, the weight percentage of all the other constituents of the silver paste may be decreased.

As already mentioned, the silver paste is applied in a silver back electrode pattern on the silicon wafer's back-side perforated dielectric passivation layer. The silver paste is applied to a dry film thickness of, for example, 5 to 30 μm. The method of silver paste application may be printing, for example, silicone pad printing or, in an embodiment, screen printing. The application viscosity of the silver paste may be 20 to 200 Pa·s when it is measured at a spindle speed of 10 rpm and 25° C. by a utility cup using a Brookfield HBT viscometer and #14 spindle.

After application, the silver paste is dried, for example, for a period of 1 to 100 minutes with the silicon wafer reaching a peak temperature in the range of 100 to 300° C. Drying can be carried out making use of, for example, belt, rotary or stationary driers, in particular, IR (infrared) belt driers.

In step (3) of the process of the present invention the dried silver paste is fired to form a silver back electrode. The firing of step (3) may be performed, for example, for a period of 1 to 5 minutes with the silicon wafer reaching a peak temperature in the range of 700 to 900° C. The firing can be carried out making use of, for example, single or multi-zone belt furnaces, in particular, multi-zone IR belt furnaces. The firing may happen in an inert gas atmosphere or in the presence of oxygen, for example, in the presence of air. During firing the organic substance including non-volatile organic material and the organic portion not evaporated during the drying may be removed, i.e. burned and/or carbonized, in particular, burned. The organic substance removed during firing includes organic solvent(s), optionally present organic polymer(s) and optionally present organic additive(s). There is a further process taking place during firing, namely sintering of the glass frit with the particulate silver. During firing the silver paste does not fire through the back-side perforated passivation layer, but it makes local contacts with the silicon substrate back surface at the places of the perforations in the passivation layer, i.e. the passivation layer survives at least essentially between the fired silver paste and the silicon substrate.

Said local contacts are physical contacts and are not to be confused with the local p+ contacts or local BSF contacts mentioned above in the section "TECHNICAL BACKGROUND OF THE INVENTION".

Firing may be performed as so-called cofiring together with a back-side aluminum paste and/or front-side metal pastes that have been applied to the PERC solar cell silicon wafer. An embodiment includes front-side silver paste and a back-side aluminum paste used for the formation of the aluminum back electrode.

EXAMPLES (1) Manufacture of Test Samples:

(i) Example Silver Pastes 1 and 2

The example silver paste 1 comprised 85 wt.-% silver powder (d50=2 μm), 14.5 wt.-% organic vehicle of polymeric resins and organic solvents and 0.5 wt.-% of glass frit (d50=8 μm).

The example silver paste 2 comprised 81 wt.-% silver powder (d50=2 μm), 17 wt.-% organic vehicle of polymeric resins and organic solvents and 2 wt.-% of glass frit (d50=8 μm). In both cases the glass frit composition was: 28 wt.-% $SiO_2$, 4.7 wt.-% $Al_2O_3$, 8.1 wt.-% $B_2O_3$, 55.9 wt.-% PbO and 3.3 wt.-% $TiO_2$; the glass had a softening point temperature of 573° C.

(ii) Formation of TLM Samples

P-type multicrystalline silicon wafers of 80 $cm^2$ area and 160 μm thickness with an n-type diffused $POCl_3$ emitter, having a $SiN_x$ ARC on the front-side and a non-perforated 100 nm thick $SiO_2/SiN_x$ rear surface dielectric stack, were screen printed on the back surface with parallel lines of the example silver pastes. The silver pastes were patterned at a nominal line width of 100 μm with a line spacing (pitch) of 2.05 mm; the dried film thickness of the silver pastes was 20 μm.

The printed wafers were then fired in a 6-zone infrared furnace supplied by Despatch. A belt speed of 580 cm/min was used with zone temperatures defined as zone 1=500° C., zone 2=525° C., zone 3=550° C., zone 4=600° C., zone 5=900° C. and the final zone set at 865° C. Using a DataPaq thermal data logger the peak wafer temperature was found to reach 730° C.

The fired wafers were subsequently laser scribed and fractured into 8 mm×42 mm TLM samples, where the parallel silver metallization lines did not touch each other. Laser scribing was performed using a 1064 nm infrared laser supplied by Optek.

(iii) Formation of Adhesion Test Samples

P-type multicrystalline silicon wafers of 243 $cm^2$ area and 160 μm thickness with an n-type diffused $POCl_3$ emitter, having a $SiN_x$ ARC on the front-side and a non-perforated $SiO_2/SiN_x$ rear surface dielectric stack were provided. The dielectric stacks were in each case processed using a 1064 nm wavelength laser to achieve multiple circular openings of 100 μm diameter, with a spacing (pitch) of 600 μm. After laser ablation the wafers were subsequently screen printed full plane with the example silver pastes and then dried. The silver pastes had a dried layer thickness of 30 μm.

The printed and dried wafers were then fired in a 6-zone infrared furnace supplied by Despatch. A belt speed of 580 cm/min was used with zone temperatures defined as zone 1=500° C., zone 2=525° C., zone 3=550° C., zone 4=600° C., zone 5=900° C. and the final zone set at 865° C. Using a DataPaq thermal data logger the peak wafer temperature was found to reach 730° C.

(2) Test Procedures:

(i) TLM Measurement

The TLM samples were measured by placing them into a GP 4-Test Pro instrument available from GP Solar for the purpose of measuring contact resistivity. The measurements were performed at 20° C. with the samples in darkness. The test probes of the apparatus made contact with 6 adjacent fine line silver electrodes of the TLM samples, and the contact resistivity (ρc) was recorded.

(ii) Fired Adhesion

In order to measure the cohesive strength of the silver metallizations the amount of material removed from the back face of the fired wafers was determined using a peel test. To this end, a transparent layer of adhesive tape (3M Scotch Magic tape grade 810) was firmly applied and subsequently removed by peeling at an angle of 45 degrees. By ratioing the area of residue on the tape to the area of material remaining on the wafer, a qualitative assessment of the adhesion could be made.

Both example silver pastes exhibited the following results:

Adhesion (area % without adhesion loss)=100%, no residue on the tape after the peel test.

The contact resistivity exceeded the upper measurable limit for the GP 4-Test Pro equipment (>364 $\Omega\cdot cm^2$).

What is claimed is:

1. A process for the formation of an electrically conductive silver back electrode of a PERC silicon solar cell comprising the steps:

(1) providing a silicon wafer having a fire through front side silver paste on an ARC layer on its front-side and a perforated dielectric passivation layer on its back-side, wherein the back-side is a dual layer passivation stack, (2) applying and drying a silver paste to form a silver back electrode pattern on the perforated dielectric passivation layer on the back-side of the silicon wafer, and (3) firing the dried silver paste, whereby the wafer reaches a peak temperature of 700 to 900° C., wherein the silver paste has no fire-through capability, no electrical contact with the silicon substrate upon firing and comprises particulate silver and an organic vehicle, wherein the silver paste comprises at least one glass frit comprising lead-free glass frits with a softening point temperature in the range of 550 to 611° C. and containing 11 to 33 wt.-% of $SiO_2$, >0 to 7 wt.-% of $Al_2O_3$ and 2 to 10 wt.-% of $B_2O_3$.

2. The process of claim 1, wherein one or more of the lead-free glass frits contain 40 to 73 wt.-% of $Bi_2O_3$.

3. The process of claim 1, wherein the total content of glass frit in the silver paste is 0.25 to 8 wt.-%.

4. The process of claim 1, wherein the particulate silver is present in a proportion of 50 to 92 wt. %, based on total silver paste composition.

5. The process of claim 1, wherein the organic vehicle content is from 20 to 45 wt. %, based on total silver paste composition.

6. The process of claim 1, wherein the silver paste comprises 0.05 to 1.5 wt.-% of at least one antimony oxide, based on total silver paste composition, wherein the at least one antimony oxide is present (i) as separate particulate constituent(s), (ii) as glass frit constituent(s) or (iii) as separate particulate constituent(s) and as glass frit constituent(s).

7. The process of claim 1, wherein the silver paste is applied by printing.

8. The process of claim 1, wherein firing is performed as cofiring together with a back-side aluminum paste and/or front-side metal pastes that have been applied to the silicon wafer to form an aluminum back electrode and/or front metal electrodes.

9. An electrically conductive silver back electrode of a PERC silicon solar cell made by the process of claim 1.

10. A PERC silicon solar cell comprising the electrically conductive silver back electrode of claim 9.

11. The process of claim 1, wherein the silver paste comprises 81 wt.-% silver powder (d50=2 μm), 17 wt.-% organic vehicle of polymeric resins and organic solvents and 2 wt.-% of glass frit (d50=8 μm), wherein the glass frit composition is 28 wt.-% $SiO_2$, 4.7 wt.-% $Al_2O_3$, 8.1 wt.-% $B_2O_3$, 55.9 wt.-% PbO and 3.3 wt.-% $TiO_2$; the glass had a softening point temperature of 573° C., wherein cohesive strength of the silver and the amount of material removed from a back face of the fired wafers was determined by applying a transparent layer of adhesive tape subsequently removed by peeling at an angle of 45 degrees, wherein ratioing the area of residue on the tape to the area of material remaining on the wafer, resulted in adhesion (area % without adhesion loss)=100%, no residue on the tape after peeling and contact resistivity exceeded an upper measurable limit for GP 4-Test Pro equipment (>364 $\Omega\cdot cm^2$).

* * * * *